US009209052B2

United States Patent
Nakajima et al.

(10) Patent No.: US 9,209,052 B2
(45) Date of Patent: Dec. 8, 2015

(54) SEMICONDUCTOR MANUFACTURING APPARATUS AND DEVICE MANUFACTURING METHOD USING SUBSTRATE DISTORTION CORRECTION

(71) Applicant: KABUSHIKI KAISHA TOSHIBA, Minato-Ku (JP)

(72) Inventors: Yumi Nakajima, Yokkaichi (JP); Kentaro Matsunaga, Yokkaichi (JP); Eiji Yoneda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 180 days.

(21) Appl. No.: 13/964,337

(22) Filed: Aug. 12, 2013

(65) Prior Publication Data

US 2014/0227807 A1 Aug. 14, 2014

(30) Foreign Application Priority Data

Feb. 8, 2013 (JP) .................................. 2013-023355

(51) Int. Cl.
*H01L 21/67* (2006.01)
*G03F 7/20* (2006.01)
*H01L 21/683* (2006.01)

(52) U.S. Cl.
CPC ...... *H01L 21/67288* (2013.01); *G03F 7/70258* (2013.01); *G03F 7/70783* (2013.01); *H01L 21/6831* (2013.01)

(58) Field of Classification Search
CPC ............ G03F 7/70258; G03F 7/70783; H01L 21/67288
See application file for complete search history.

(56) References Cited

U.S. PATENT DOCUMENTS

2006/0114436 A1* 6/2006 Oesterholt et al. .............. 355/55
2008/0309909 A1* 12/2008 Yamamoto ....................... 355/72
2010/0183987 A1 7/2010 Yonekawa

FOREIGN PATENT DOCUMENTS

| JP | 2005-166951 | 6/2005 |
| JP | 2007-335665 | 12/2007 |
| JP | 2008-147337 | 6/2008 |
| JP | 2008-226973 | 9/2008 |
| JP | 2009-164399 | 7/2009 |
| JP | 2010-501999 | 1/2010 |

* cited by examiner

*Primary Examiner* — Peter B Kim
*Assistant Examiner* — Michelle Iacoletti
(74) *Attorney, Agent, or Firm* — Oblon, McClelland, Maier & Neustadt, L.L.P.

(57) ABSTRACT

A semiconductor manufacturing apparatus according to the present embodiment includes a vacuum chamber. A stage mounts a semiconductor substrate thereon within the vacuum chamber. An electrostatic chuck fixes the semiconductor substrate onto the stage. A sensor detects a height of a surface of the semiconductor substrate fixed onto the stage by the electrostatic chuck. A processor determines whether the surface of the semiconductor substrate is distorted based on the height of the surface of the semiconductor substrate. The processor calculates correction values for a pattern transferred onto the surface of the semiconductor substrate by exposure based on the height of the surface of the semiconductor substrate when the surface of the semiconductor substrate is distorted. An exposure part exposes the surface of the semiconductor substrate to light using the correction values.

10 Claims, 8 Drawing Sheets

SEMICONDUCTOR MANUFACTURING APPARATUS AND DEVICE MANUFACTURING METHOD USING SUBSTRATE DISTORTION CORRECTION

CROSS REFERENCE TO RELATED APPLICATIONS

This application is based upon and claims the benefit of priority from the prior Japanese Patent Application No. 2013-023355, filed on Feb. 8, 2013, the entire contents of which are incorporated herein by reference.

FIELD

The embodiments of the present invention relate to a semiconductor manufacturing apparatus and a manufacturing method of a semiconductor device.

BACKGROUND

Development of an exposure apparatus using EUV (Extreme Ultra Violet) light (hereinafter, also "EUV exposure apparatus") is underway so as to form downscaled semiconductor devices.

Because of the attenuation of the EUV light in the air, the interior of the EUV exposure apparatus is kept in a vacuum. In this case, the EUV exposure apparatus is unable to use a vacuum chuck, so that the EUV exposure apparatus includes an electrostatic chuck for fixing a semiconductor substrate. The electrostatic chuck is excellent in holding power and temperature control over the semiconductor substrate because the electrostatic chuck attracts the entire back surface of the semiconductor substrate.

However, when a foreign matter is present on a wafer stage, the surface of the semiconductor substrate is distorted because the electrostatic chuck attracts the semiconductor substrate in a state where the foreign matter is put between the wafer stage and the semiconductor substrate. When the EUV exposure apparatus exposes the semiconductor substrate to the EUV light in a state where the surface of the semiconductor substrate is distorted, a transferred pattern by the exposure to the light has a distortion in an opposite direction to that of the distortion of the semiconductor substrate generated during the attraction of the semiconductor substrate when the semiconductor substrate is unloaded from the wafer stage and the surface of the semiconductor substrate returns to an undistorted state.

To remove the foreign matter on the wafer stage, it is necessary to release the vacuum state of a chamber of the EUV exposure apparatus to release the interior of the chamber to the atmospheric pressure. Accordingly, it is impossible to remove the foreign matter on the wafer stage instantly or frequently.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

A semiconductor manufacturing apparatus according to the present embodiment includes a vacuum chamber. A stage mounts a semiconductor substrate thereon within the vacuum chamber. An electrostatic chuck fixes the semiconductor substrate onto the stage. A sensor detects a height of a surface of the semiconductor substrate fixed onto the stage by the electrostatic chuck. A processor determines whether the surface of the semiconductor substrate is distorted based on the height of the surface of the semiconductor substrate. The processor calculates correction values for a pattern transferred onto the surface of the semiconductor substrate by exposure based on the height of the surface of the semiconductor substrate when the surface of the semiconductor substrate is distorted. An exposure part exposes the surface of the semiconductor substrate to light using the correction values.

(First Embodiment)

Figure 1A:
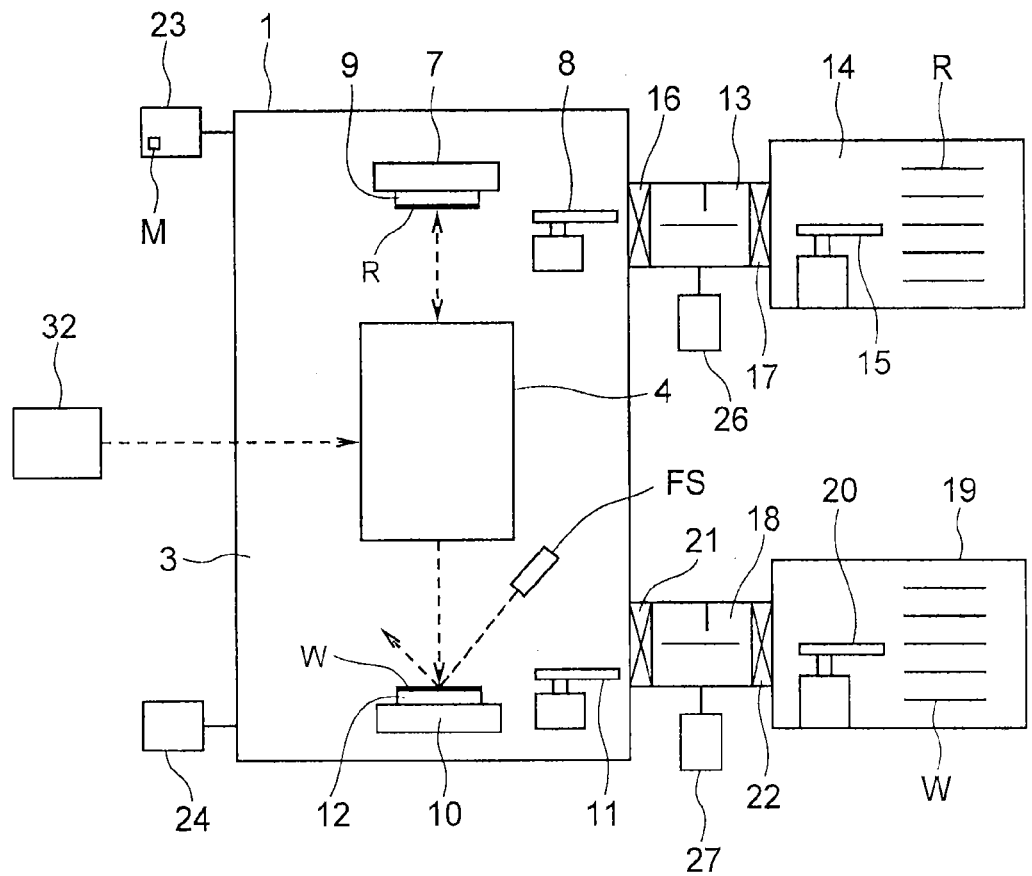
FIG. 1A is an example of a configuration of an EUV exposure apparatus 100 according to a first embodiment.

FIG. 1A is an example of a configuration of an EUV exposure apparatus 100 according to a first embodiment. The EUV exposure apparatus 100 includes a vacuum chamber 1, a reticle stage 7, a wafer stage 10, electromagnetic chucks 9 and 12, an optical system 4 serving as an exposure part, a reticle transport arm 8, a wafer transport arm 11, an arithmetic control part 23 serving as a processor, and a vacuum device 24.

The vacuum device 24 keeps the interior of the vacuum chamber 1 in a vacuum (a reduced-pressure atmosphere of about $1 \times 10^{-4}$ Pa, for example). The reticle stage 7, the wafer stage 10, and the optical system 4 are provided within the vacuum chamber 1 and exposure using EUV light is executed within the vacuum chamber 1.

The reticle stage 7 includes the electromagnetic chuck 9 and a reflection reticle R on which a circuit pattern is formed is attached onto the reticle stage 7 so as to expose a semiconductor substrate W to the EUV light. The electromagnetic chuck 9 attracts and fixes the reticle R. The reticle stage 7 is provided to be movable in a scanning direction during the exposure.

The wafer stage 10 includes the electromagnetic chuck 12 and the semiconductor substrate W that is an exposure target is mounted on the wafer stage 10. The wafer stage 10 is provided to be movable in the scanning direction during the exposure.

The reticle transport arm 8 carries the reticle R from a load lock chamber 13 into the vacuum chamber 1 and transports the carried reticle R onto the reticle stage 7.

The load lock chamber 13 is provided so as to receive and deliver the reticle R between a reticle exchange chamber 14 and the vacuum chamber 1. A vacuum device 26 can make the interior of the load lock chamber 13 into a vacuum state. Gate valves 16 and 17 are provided on both sides of the load lock chamber 13, respectively. When the load lock chamber 13 receives the reticle R from the reticle exchange chamber 14, the gate valve 16 is closed and the gate valve 17 is opened. At this time, an internal pressure of the load lock chamber 13 is equal to the atmospheric pressure. On the other hand, when the load lock chamber 13 carries the reticle R into the vacuum chamber 1, the gate valve 17 is closed and the gate valve 16 is opened. After closing the gate valve 17 and before the opening the gate valve 16, the vacuum device 26 makes the interior of the load lock chamber 13 into the vacuum state.

The reticle exchange chamber 14 accommodates a plurality of reticles R. A reticle transport arm 15 receives and delivers the reticle R between the reticle exchange chamber 14 and the load lock chamber 13.

The wafer transport arm 11 carries the semiconductor substrate W from a load lock chamber 18 into the vacuum chamber 1 and mounts the carried semiconductor substrate W onto the wafer stage 10.

The load lock chamber 18 is provided so as to receive and deliver the semiconductor substrate W between a wafer exchange chamber 19 and the vacuum chamber 1. A vacuum device 27 can make the interior of the load lock chamber 18 into a vacuum state. Gate valves 21 and 22 are provided on both sides of the load lock chamber 18, respectively. When the load lock chamber 18 receives the semiconductor substrate W from the wafer exchange chamber 19, the gate valve 21 is closed and the gate valve 22 is opened. At this time, an internal pressure of the load lock chamber 18 is equal to the atmospheric pressure. On the other hand, when the load lock chamber 18 carries the semiconductor substrate W into the vacuum chamber 1, the gate valve 22 is closed and the gate valve 21 is opened. After closing the gate valve 22 and before the opening the gate valve 21, the vacuum device 27 makes the interior of the load lock chamber 18 into the vacuum state.

The wafer exchange chamber 19 accommodates a plurality of semiconductor substrates W. A wafer transport arm receives and delivers the semiconductor substrate W between the wafer exchange chamber 19 and the load lock chamber 18.

An EUV light source 32 generates the EUV light and supplies the EUV light to the optical system 4. The optical system 4 exposes the semiconductor substrate W to the EUV light and transfers the circuit pattern formed on the reticle R attached onto the reticle stage 7 onto the semiconductor substrate W mounted on the wafer stage 10. During the exposure, the optical system 4 irradiates the EUV light onto the reticle R and exposes the semiconductor substrate W to the exposure light (EUV light) reflected by the reticle R. That is, the optical system 4 performs irradiation of the EUV light onto the reticle R and projection of an image onto the semiconductor substrate W. A photosensitive material (a resist, for example) is applied onto a surface of the semiconductor substrate W in advance, and the photosensitive material on the semiconductor substrate W is exposed to the exposure light. The optical system 4 executes the exposure while scanning the reticle stage 7 and the wafer stage 10 in the scanning direction.

The arithmetic control part 23 controls operations performed by respective constituent elements of the EUV exposure apparatus 100 such as the reticle stage 7 and the wafer stage 10. For example, the arithmetic control part 23 controls a mask position based on a measurement result of a laser interferometer (not shown) and a detection result of a focus sensor FS. As shown in FIG. 1A, in a case where one wafer stage 10 is provided within the vacuum chamber 1 (that is, where the EUV exposure apparatus 100 is a single-stage exposure apparatus), the focus sensor FS is arranged laterally to the optical system 4 and detects a height of the surface of the semiconductor substrate W to be irradiated with the exposure light.

The arithmetic control part 23 includes a memory M, in which the arithmetic control part 23 can store therein the measurement result, the detection result, and the like.

Figure 1B:
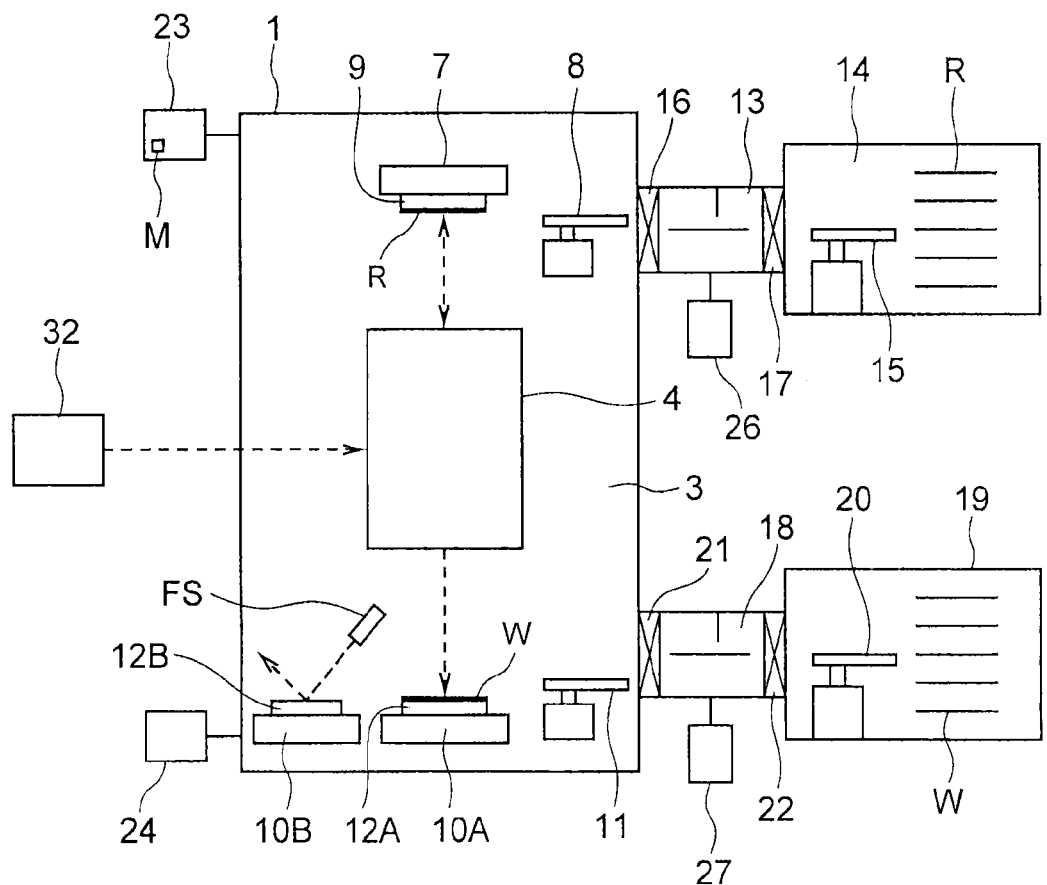
FIG. 1B is an example of a configuration of an EUV exposure apparatus according to a modification of the first embodiment.

FIG. 1B is an example of a configuration of an EUV exposure apparatus according to a modification of the first embodiment. The EUV exposure apparatus 100 according to the modification is a dual-stage exposure apparatus and a plurality of wafer stages 10A and 10B are provided within the vacuum chamber 1. The wafer stages 10A and 10B include electrostatic chucks 12A and 12B, respectively. In this case, the focus sensor FS detects the height of the surface of the semiconductor substrate W mounted on the wafer stage 10B separately from the semiconductor substrate W on the wafer stage 10A to be irradiated with the exposure light. The other constituent elements of the EUV exposure apparatus 100 according to the modification can be configured similarly to those of the EUV exposure apparatus 100 according to the first embodiment.

Figure 2A:
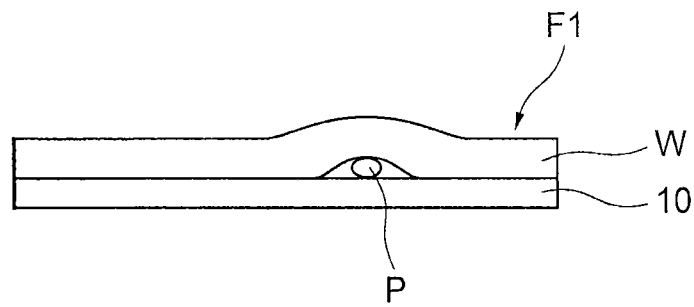
FIGS. 2A and 2B show a state where a particle P is present between the wafer stage 10 and the semiconductor substrate W mounted on the wafer stage 10.
Figure 2B:
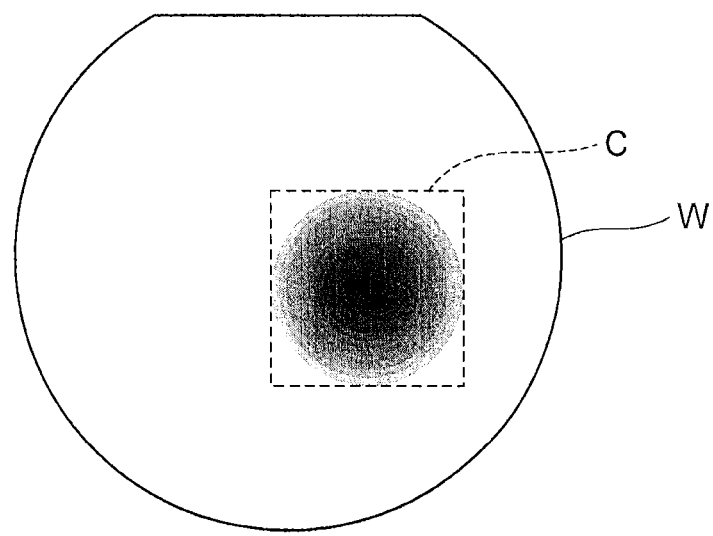

FIGS. 2A and 2B show a state where a particle P is present between the wafer stage 10 and the semiconductor substrate W mounted on the wafer stage 10. The wafer stage 10 is formed using ceramics, for example, and thicker than the semiconductor substrate W. Therefore, when the particle P is present between the wafer stage 10 and the semiconductor substrate W, the semiconductor substrate 10 is lifted and a height of a surface F1 of the semiconductor substrate W locally increases. In FIG. 2B, a dashed border C denotes a portion where the particle P is present.

Figure 3:
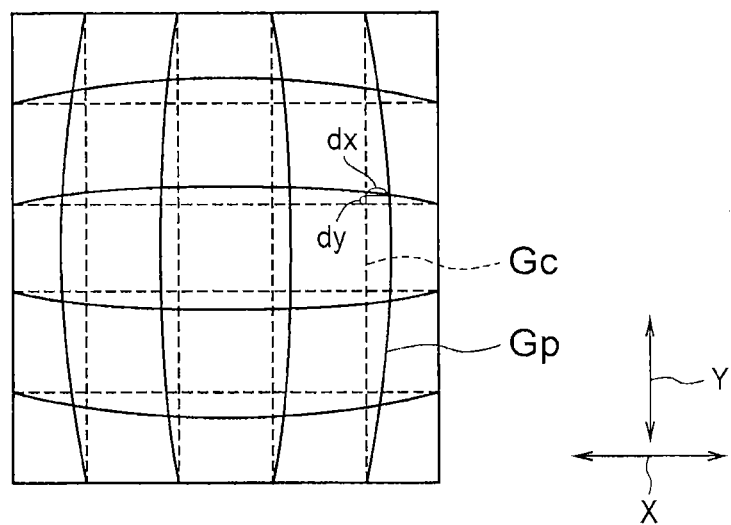
FIG. 3 shows a dashed border C part of FIG. 2B.

FIG. 3 shows a dashed border C part of FIG. 2B. The interior of the dashed border C is represented by a grid so that the dashed border C is easier to understand. Grid cells of the grid are as fine as 1 mm or less and the EUV exposure apparatus 100 can correct a position of the pattern transferred onto the semiconductor substrate W at each grid point.

A dashed grid Gc is a square grid virtually indicated on a planar surface of the semiconductor substrate W and is a normal grid when no particle P is present. When the particle P is present between the semiconductor substrate W and the wafer stage 10, the surface of the semiconductor substrate W is lifted by the particle P. Therefore, in this case, the square Gc is distorted as indicated by a solid grid Gp.

Figure 4:
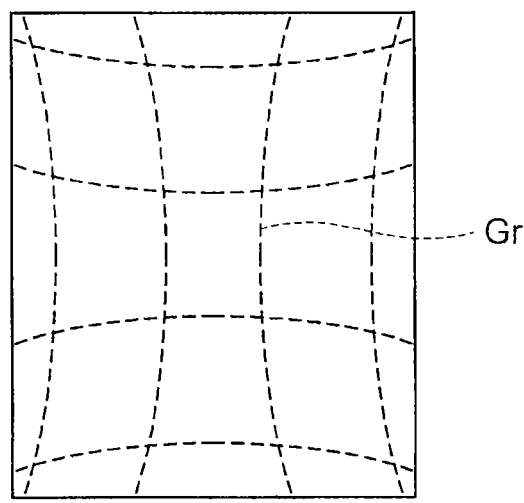
FIG. 4 shows a grid Gr having a distortion in an opposite direction to that of the distortion of the grid Gp shown in FIG. 3.

Generally, the EUV exposure apparatus 100 is assumed to transfer the circuit pattern onto the planar surface of the semiconductor substrate W. Accordingly, when the EUV exposure apparatus 100 executes the exposure in a state where the particle P is present between the semiconductor substrate W and the wafer stage 10, the circuit pattern on the semiconductor substrate W is distorted oppositely when the semiconductor substrate W is unloaded from the wafer stage 10 and the surface of the semiconductor substrate W returns to the planar surface. For example, in a case of transferring the square grid Gc shown in FIG. 3 onto the semiconductor substrate W in the state where the particle P is present between the semiconductor substrate W and the wafer stage 10, the transferred pattern has a distortion in an opposite direction to that of the distortion of the grid Gp shown in FIG. 3 as indicated by a grid Gr shown in FIG. 4 when the semiconductor substrate W is unloaded from the wafer stage 10.

Therefore, the EUV exposure apparatus 100 according to the first embodiment corrects the circuit pattern and transfers the corrected circuit pattern during the exposure so that the transferred pattern on the semiconductor substrate W becomes a normal circuit pattern when the semiconductor substrate W is unloaded from the wafer stage 10. Correction values (dx, dy) are shown in FIG. 3.

The arithmetic control part 23 calculates the correction values for correcting the distortion of the circuit pattern transferred onto the surface of the semiconductor substrate W by the exposure of the semiconductor substrate W to the EUV light based on the height of the surface of the semiconductor substrate W detected by the focus sensor FS provided within the optical system 4. The correction values are calculated as follows.

Figures 5A, 5B:
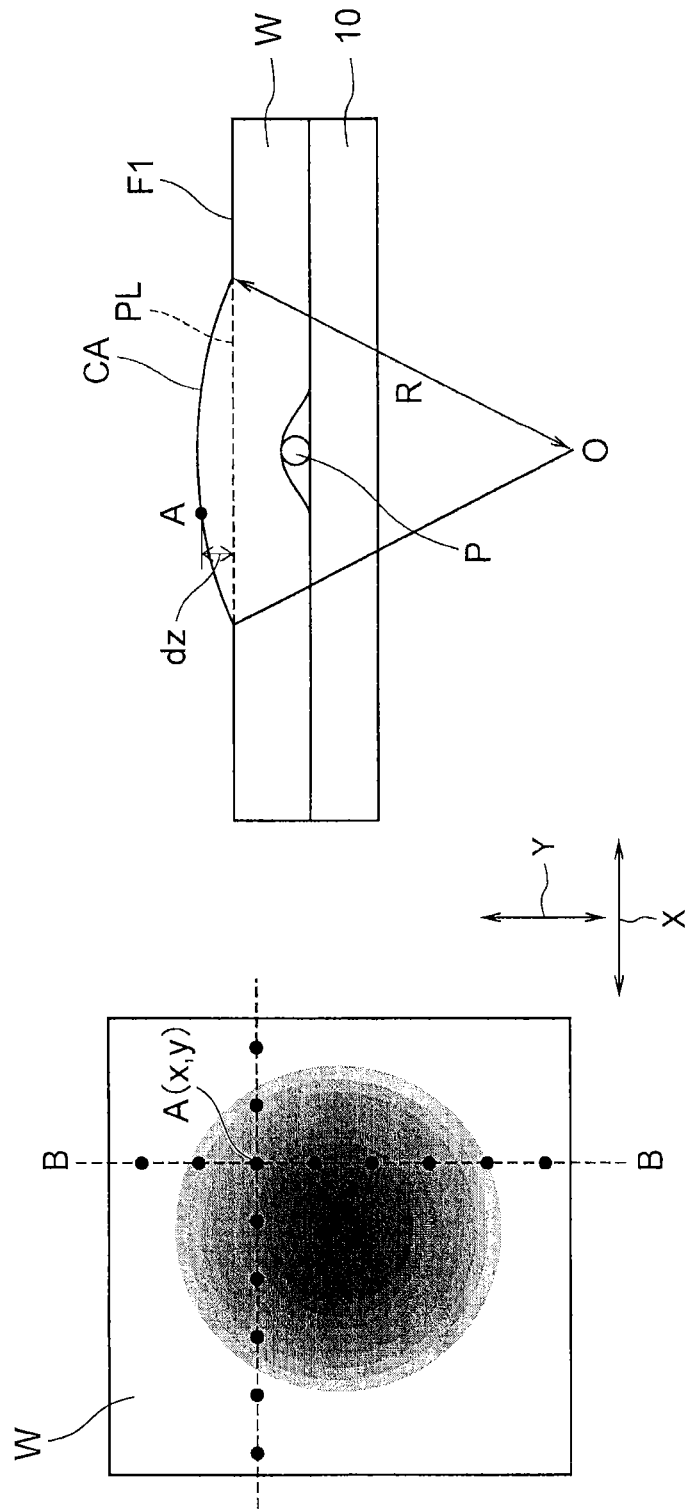
FIGS. 5A and 5B are explanatory diagrams of calculation of the correction values.

FIGS. 5A and 5B are explanatory diagrams of calculation of the correction values. In this calculation, the correction values (dx, dy) for a grid point A shown in FIG. 5A are calculated. FIG. 5B is a cross-sectional view taken along a line B-B of FIG. 5A. The line B-B is the line along a direction of a Y-axis passing through the grid point A. The points shown in FIGS. 5A and 5B represent grid points on an X-axis and the Y-axis passing through the grid point A.

A method of calculating the correction value dy in the Y-axis direction for the grid point A (x, y) is described. A method of calculating the correction value dx in the X-axis direction for the grid point A (x, y) is not described here in detail because the method can be easily estimated from the method of calculating the correction value dy.

When the particle P is present between the wafer stage 10 and the semiconductor substrate W, the surface F1 of the semiconductor substrate W is distorted as shown in FIG. 5B. At the grid point A, a height dz of the surface F1 relative to a planar surface PL of the semiconductor substrate W is measured by the focus sensor FS within the optical system 4 as described above. The focus sensor FS also measures heights of the grid points other than the grid point A. The arithmetic control part 23 obtains a circular arc CA in a cross-section along the line B-B based on the heights of the respective grid points by approximation. A center point O and a radius R of the circular arc CA are obtained from an approximate value of the circular arc CA.

Figure 6B:
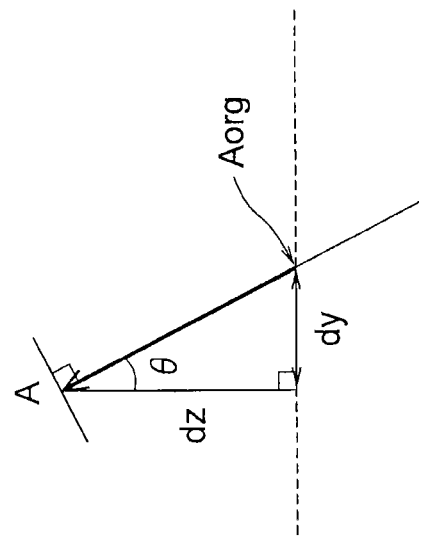
FIG. 6B is an explanatory diagram showing the correction value dy in the Y-axis direction for the grid point A.
Figure 6A:
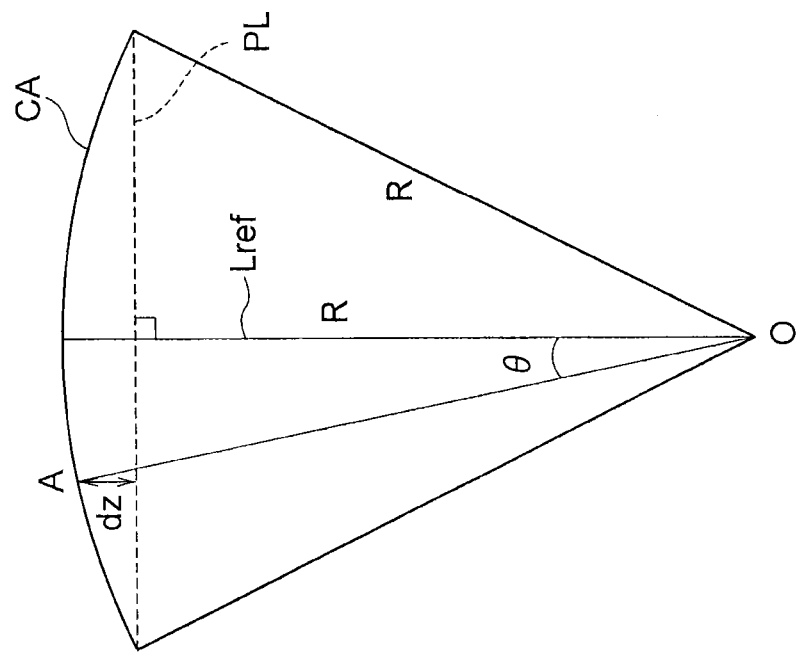
FIG. 6A is an explanatory diagram showing the circular arc CA, the radius R, and the center point O.

FIG. 6A is an explanatory diagram showing the circular arc CA, the radius R, and the center point O. FIG. 6B is an explanatory diagram showing the correction value dy in the Y-axis direction for the grid point A. In FIG. 6A, a dashed line denotes the planar surface PL of the semiconductor substrate W. A line Lref is a line passing through the center point O and perpendicular to the planar surface PL of the semiconductor substrate W. A line OA is a line perpendicular to a tangential direction of the circular arc CA at the grid point A and passing through the center point O. An angle $\theta_y$ is an angle formed between the lines Lref and OA. In other words, the angle $\theta_y$ is the angle formed between a surface contacting the distorted surface of the semiconductor substrate W at the grid point A and the planar surface PL of the semiconductor substrate W in the cross-section in the Y-axis direction passing through the grid point A. With reference to FIG. 6B, it can be understood that the correction value dy is represented by Equation (1).

$$dy = dz \times \tan \theta_y \quad (1)$$

Similarly, the arithmetic control part 23 calculates the correction value dx in the X-axis direction for the grid point A. Therefore, the correction value dx is represented by Equation (2).

$$dx = dz \times \tan \theta_x \quad (2)$$

In this equation, an angle $\theta_x$ is an angle formed between the planar surface PL of the semiconductor substrate W and the surface contacting the distorted surface of the semiconductor substrate W at the grid point A in a cross-section in the X-axis direction passing through the grid point A. In this way, the arithmetic control part 23 can calculate the correction values (dx, dy).

When the particle P is not present, the grid point A is originally located at a position of a grid point Aorg. In other words, the particle P moves the grid point Aorg to the grid point A on the Y-axis. To adjust the transferred pattern according to the grid point A, the optical system 4 exposes the semiconductor substrate W to the EUV light after moving the grid point Aorg to the grid point A using the correction values (dx, dy). Similarly, the optical system 4 performs the exposure for the other grid points necessary to correct.

The optical system 4 corrects the exposure based on the correction values (dx, dy) on the surface of the semiconductor substrate W. Exposure correction (correction of a shot shape) can be normally represented by Equations (3) and (4).

$$dx = k_1 + k_3 x + k_5 y + (k_7 x_2 + k_9 xy \ldots) \quad (3)$$

$$dy = k_2 + k_4 y + k_6 x + (k_8 y_2 + k_{10} yx \ldots) \quad (4)$$

$k_1$, $k_2$: Shift factors,
$k_3$, $k_4$: Magnification factors, and
$k_5$, $k_6$: Rotation factors In the Equations (3) and (4), higher-order correction is in parentheses.

In this way, the EUV exposure apparatus 100 according to the first embodiment can correct the exposure so as to be able to transfer the pattern supposed to be transferred to the grid point Aorg to the grid point A. The EUV exposure apparatus 100 can thereby transfer the circuit pattern having the distortion nearly equal to that of the surface F1 of the semiconductor substrate W onto the surface F1 of the semiconductor substrate W. Therefore, after the exposure, when the semiconductor substrate W is unloaded from the wafer stage 10 and the surface of the semiconductor substrate W returns to the planar surface, a distorted state of the semiconductor substrate W returns to a planar state and the circuit pattern on the semiconductor substrate W also returns to a normal state. That is, even if the semiconductor substrate W is distorted during the exposure, the transferred pattern has no distortion when the distorted state of the semiconductor substrate W returns to an undistorted state. Therefore, the EUV exposure apparatus 100 enables highly accurate exposure whether the particle P is present.

Figure 7:
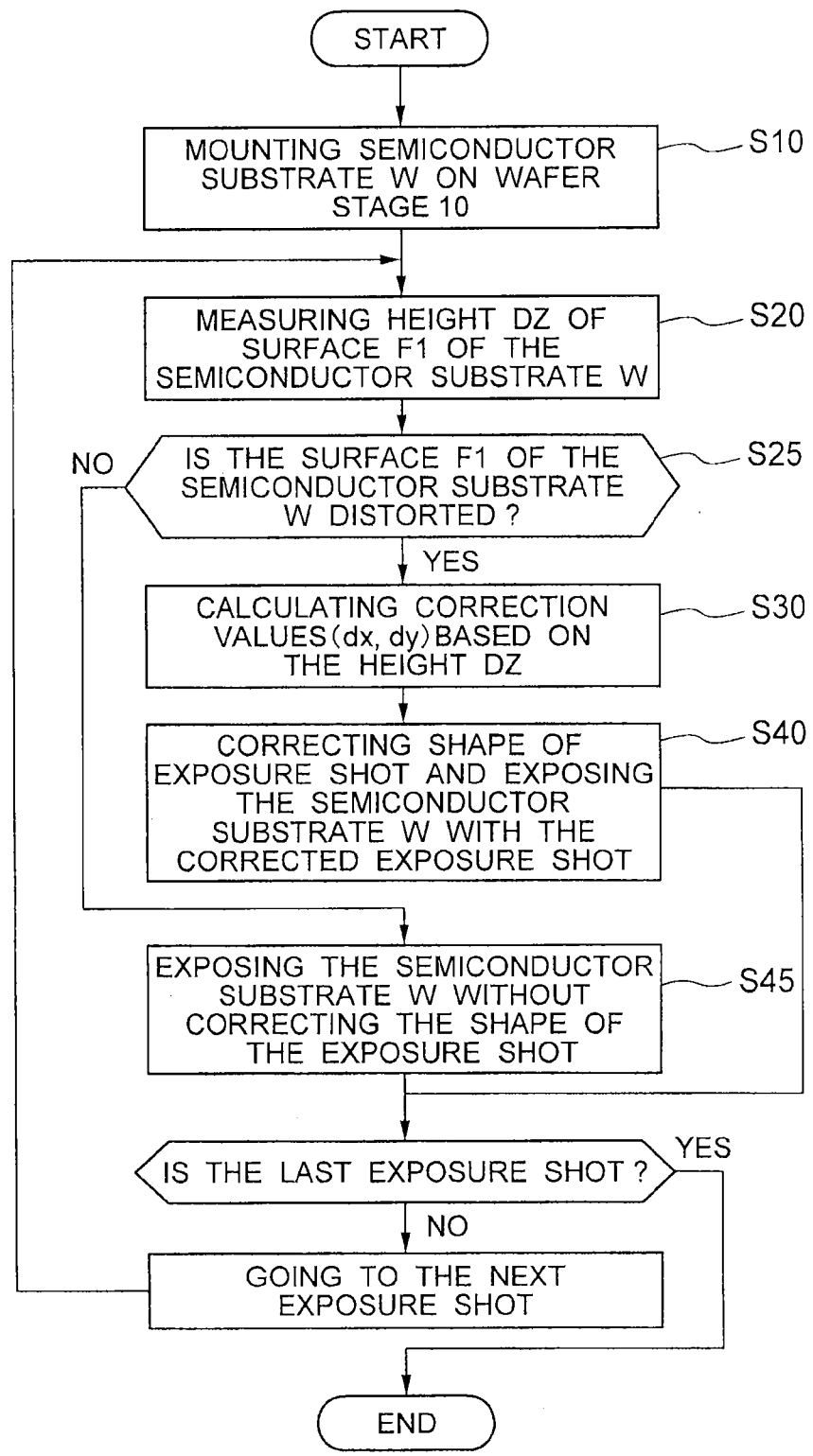
FIG. 7 is a flowchart showing an EUV exposure method according to the first embodiment.

FIG. 7 is a flowchart showing an EUV exposure method according to the first embodiment. First, the semiconductor substrate W is mounted on the wafer stage 10 (S10).

Next, the focus sensor FS measures the height dz of the surface of the semiconductor substrate W (S20). When the particle P is present, the semiconductor substrate W is distorted at and around the particle P. Therefore, the number of corrected grid points is not limited to one but is sometimes two or more. Therefore, the focus sensor FS measures the height dz at each of these grid points.

The arithmetic control part 23 determines whether the surface F1 of the semiconductor substrate W is distorted, that is, determines whether correction is necessary (S25). The arithmetic control part 23 can make the determination as to whether the surface F1 of the semiconductor substrate W is distorted by whether the height dz is equal to or larger than a preset threshold or is smaller than the preset threshold. It suffices to preset the threshold and store the threshold in the memory M.

When the surface F1 of the semiconductor substrate W is distorted (YES at S25), the arithmetic control part 23 calculates the correction values (dx, dy) based on the height dz (S30). The arithmetic control part 23 calculates the correction values (dx, dy) at each of the grid points necessary to correct. At this time, the arithmetic control part 23 can calculate the correction values (dx, dy) using the Equation (1) as already described above.

The optical system 4 corrects the transferred pattern (that is, a shape of an exposure shot) using the Equations (3) and (4) as already described above and then exposes the semiconductor substrate W to the EUV light (S40). The optical system 4 corrects the transferred pattern at each of the grid points necessary to correct and then exposes the semiconductor substrate W to the EUV light. At this time, the optical system 4 transfers the circuit pattern along the distortion of the semiconductor substrate W.

On the other hand, when the surface F1 of the semiconductor substrate W is not distorted (NO at S25), the EUV exposure apparatus 100 executes the exposure without correcting the shape of the exposure shot (S45).

Steps S20 to S45 are executed for every exposure shot and repeated. When a last exposure shot ends, the semiconductor substrate W is unloaded from the wafer stage 10 and the next semiconductor substrate W is loaded onto the wafer stage 10.

According to the first embodiment, the EUV exposure apparatus 100 can execute the highly accurate exposure whether the particle P is present and can decrease the frequency of cleaning the wafer stage 10.

(Second Embodiment)

Figure 8:
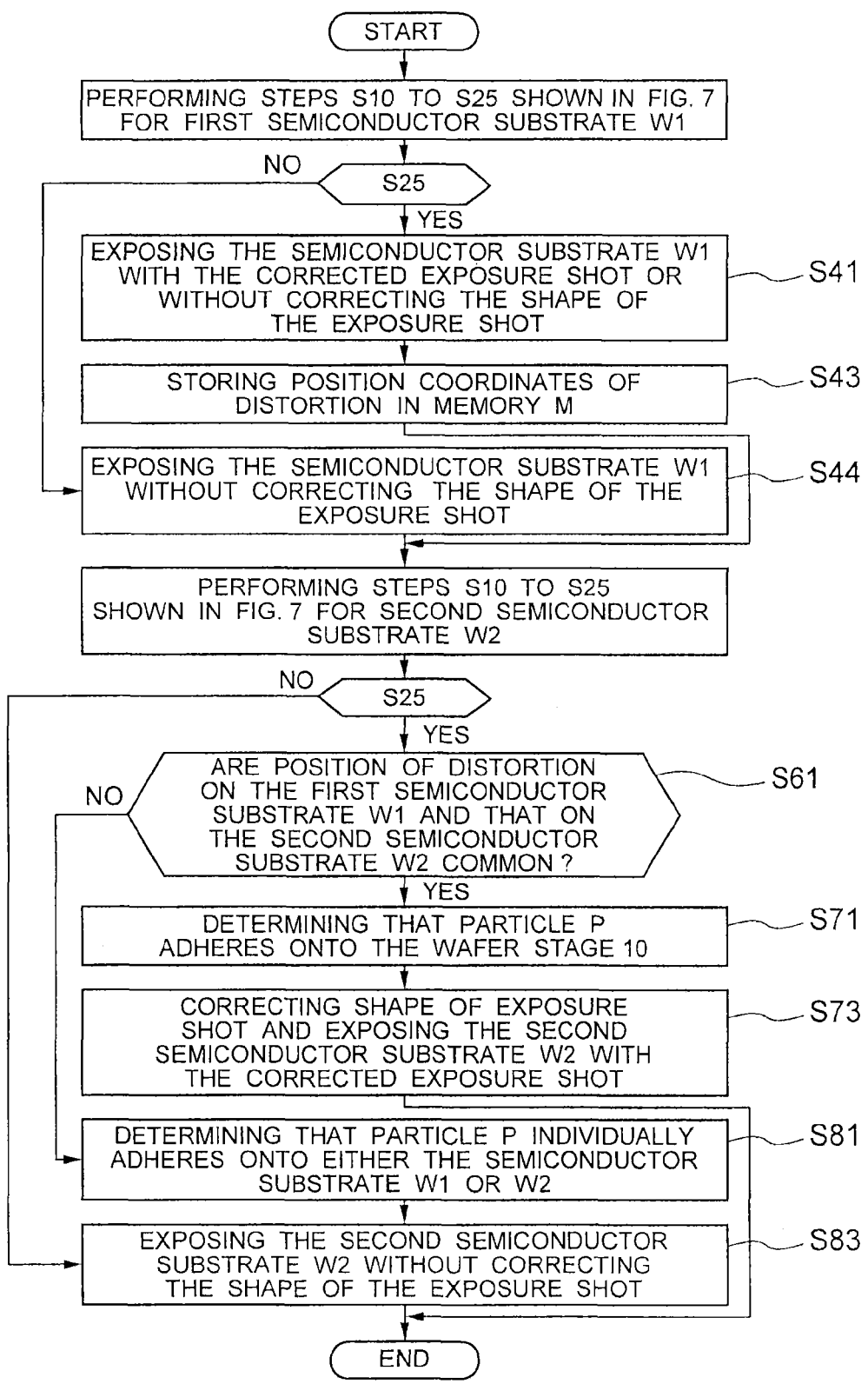
FIG. 8 is a flowchart showing an EUV exposure method according to a second embodiment.

FIG. 8 is a flowchart showing an EUV exposure method according to a second embodiment. In the second embodiment, the particle P on the wafer stage 10 is distinguished from that adhering onto a back surface of the semiconductor substrate W. The EUV exposure apparatus 100 corrects the exposure shot when the particle P is present on the wafer stage 10. Configurations of the EUV exposure apparatus can be identical to those of the EUV exposure apparatus 100 according to the first embodiment.

When the particle P adheres onto the wafer stage 10, a plurality of semiconductor wafers W have distortions at a common position in planes of the semiconductor wafers W. On the other hand, when the particle P adheres onto one of or each of the semiconductor substrates W, distortions are not generated at the common position but at individual positions in the planes of the semiconductor wafers W. Therefore, monitoring of the position at which each of a plurality of semiconductor substrates W has a distortion makes it possible to distinguish the particle P present on the wafer stage 10 from that adhering onto the back surface of one of or each of the semiconductor substrates W.

More specifically, the EUV exposure apparatus 100 performs Steps S10 to S25 shown in FIG. 7 for a first semiconductor substrate W1.

When the surface F1 of the semiconductor substrate W1 is distorted (YES at S25), the EUV exposure apparatus 100 corrects the shape of the exposure shot or executes the exposure without any correction (S41). However, the arithmetic control part 23 stores therein position coordinates of the distortion on the surface F1 of the semiconductor substrate W1 in the memory M (S43).

When the surface F1 of the semiconductor substrate W1 is not distorted (NO at S25), the EUV exposure apparatus 100 executes the exposure without correcting the shape of the exposure shot (S44).

After finishing the exposure of the semiconductor substrate W1 to the EUV light, the EUV exposure apparatus 100 performs Steps S10 to S25 shown in FIG. 7 for a second semiconductor substrate W2.

When the surface F1 of the semiconductor substrate W2 is distorted (YES at S25), the arithmetic control part 23 further compares a position of the distortion on the first semiconductor substrate W1 with that on the second semiconductor substrate W2 and determines whether those positions are common (S61). At this time, it suffices that the arithmetic control part 23 determines whether a grid point at which the distortion is generated is at almost the same position in planes of the semiconductor substrates W1 and W2.

When the position of the distortion on the semiconductor substrates W1 almost corresponds to that on the semiconductor substrate W2 (YES at S61), the arithmetic control part 23 determines that the particle P adheres onto the wafer stage 10 (S71). In this case, the EUV exposure apparatus 100 corrects the shape of the exposure shot at a time of the exposure of the second semiconductor substrate W2 to the EUV light (S73). That is, the EUV exposure apparatus 100 performs Steps S30 to S45 shown in FIG. 7 for the semiconductor substrate W2.

On the other hand, when the position of the distortion on the semiconductor substrate W1 does not correspond to that on the semiconductor substrate W2 (NO at S61), the arithmetic control part 23 determines that the particle P individually adheres onto either the semiconductor substrate W1 or W2 (S81). In this case, the EUV exposure apparatus 100 executes the exposure for the semiconductor substrate W2 without correcting the shape of the exposure shot (S83).

The EUV exposure apparatus 100 reworks the semiconductor substrate W1 depending on the necessity. For example, when the exposure shot is not corrected for the semiconductor substrate W1 at Step S41 despite the adhesion of the particle P onto the wafer stage 10, the EUV exposure apparatus 100 performs a lithographic process again for the semiconductor substrate W1. At this time, the EUV exposure apparatus 100 corrects the exposure shot and exposes the semiconductor substrate W1 to the EUV light. Needless to mention, there is no need to rework the semiconductor substrate W1 when the exposure shot is corrected for the semiconductor substrate W1.

Conversely, when the exposure shot is corrected for the semiconductor substrate W1 at Step S41 despite the individual adhesion of the particle P onto either the semiconductor substrate W1 or W2, the EUV exposure apparatus 100 similarly performs the lithographic process again for the semiconductor substrate W1. At this time, the EUV exposure apparatus 100 exposes the semiconductor substrate W1 to the EUV light without correcting the exposure shot. Needless to mention, when the exposure shot is not corrected for the semiconductor substrate W1, there is no need to rework the semiconductor substrate W1.

In this way, the EUV exposure apparatus 100 according to the second embodiment corrects the exposure shot when the particle P is present on the wafer stage 10 and does not correct the exposure shot when the particle P adheres individually onto either the semiconductor substrate W1 or W2. A reason for making such a distinction is as follows.

The semiconductor substrate W is not necessarily processed by the same exposure apparatus in all lithographic processes and often processed by different exposure apparatuses. Therefore, when the particle P is present on the wafer stage 10, the semiconductor substrate W can be processed by another exposure apparatus in the next lithographic process by correcting the exposure shot.

However, when the particle P adheres onto the semiconductor substrate W, the semiconductor substrate W is distorted in the same way no matter what exposure apparatuses is used to process the semiconductor substrate W. In this case, no error occurs to the overlay of a base pattern already formed on the semiconductor substrate W with a transferred pattern for which the exposure is to be executed. Therefore, this means that it is unnecessary for the EUV exposure apparatus 100 to correct the exposure shot.

Needless to mention, the distortion of the semiconductor substrate W is eliminated during the exposure when the particle P is removed from the semiconductor substrate W. Therefore, the EUV exposure apparatus 100 can correct the exposure shot even when the particle P adheres onto the semiconductor substrate W as described in the first embodiment.

In this way, the EUV exposure apparatus 100 according to the second embodiment executes the exposure using the correction values when distortions are present at the common position to a plurality of semiconductor substrates W. The EUV exposure apparatus 100 according to the second embodiment executes the exposure without using any correction values when the semiconductor substrates W have distortions at different positions, respectively. The EUV exposure apparatus 100 can thereby distinguish the particle P adhering onto the wafer stage 10 from that adhering onto the back surface of each of the semiconductor substrates W and can correct the exposure shot depending on the necessity.

The EUV exposure apparatus 100 according to the second embodiment distinguishes the particle P adhering onto the wafer stage 10 from that adhering onto the back surface of one of the two semiconductor substrates W1 and W2 depending on the position of the distortion on the semiconductor substrate W1 or W2. However, the EUV exposure apparatus 100 can distinguish the particle P adhering onto the wafer stage 10 from that adhering onto the back surface of one of the semiconductor substrates W using three or more semiconductor substrates W.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a vacuum chamber;
a stage mounting a semiconductor substrate thereon within the vacuum chamber;
an electrostatic chuck fixing the semiconductor substrate onto the stage;
a sensor detecting a height of a surface of the semiconductor substrate fixed onto the stage by the electrostatic chuck;
a processor determining whether the surface of the semiconductor substrate is distorted based on the height of the surface of the semiconductor substrate, and calculating correction values for a pattern transferred onto the surface of the semiconductor substrate by exposure based on the height of the surface of the semiconductor substrate when the surface of the semiconductor substrate is distorted; and
an exposure part exposing the surface of the semiconductor substrate to light using the correction values, wherein
when the plurality of semiconductor substrates are distorted at a common position, the exposure part exposes the surfaces of a plurality of the semiconductor substrates to the light using the correction values, and
when the plurality of semiconductor substrates are distorted at different positions, the exposure part exposes the surfaces of the semiconductor substrates to the light without using correction values for correcting the distortions.

2. The apparatus of claim 1, wherein
the correction values (dx, dy) for a certain coordinate point (x, y) on a distorted surface of the semiconductor substrate are represented by $$dx = dz \times \tan \theta_x$$

$$dy = dz \times \tan \theta_y$$

when it is assumed that a height of the coordinate point (x, y) relative to a planar surface of the semiconductor substrate is dz, an angle formed between the planar surface of the semiconductor substrate and a surface contacting the distorted surface of the semiconductor substrate in a cross-section in an X-axis direction is $\theta_x$, and that an angle formed between the planar surface of the semiconductor substrate and a surface contacting the distorted surface of the semiconductor substrate in a cross-section in a Y-axis direction is $\theta_y$.

3. The apparatus of claim 2, wherein
the sensor detects a height of a plurality of grid points on the surface of the semiconductor substrate,
the processor calculates the correction values for the pattern transferred onto the surface of the semiconductor substrate by the exposure for the respective grid points when the surface of the semiconductor substrate is distorted, and
the exposure part exposes the surface of the semiconductor substrate to the light using the correction values for the grid points.

4. The apparatus of claim 1, wherein
the sensor detects a height of a plurality of grid points on the surface of the semiconductor substrate,
the processor calculates the correction values for the pattern transferred onto the surface of the semiconductor substrate by the exposure for the respective grid points when the surface of the semiconductor substrate is distorted, and
the exposure part exposes the surface of the semiconductor substrate to the light using the correction values for the grid points.

5. The apparatus of claim 1, wherein the exposure part exposes the surface of the semiconductor substrate to EUV light.

6. A manufacturing method of a semiconductor device using a semiconductor manufacturing apparatus comprising an electrostatic chuck fixing a semiconductor substrate onto a stage within a vacuum chamber, a sensor detecting a height of a surface of the semiconductor substrate, a processor calculating correction values in order to correct a distortion of a pattern transferred onto the surface of the semiconductor substrate by exposure, and an exposure part exposing the surface of the semiconductor substrate to light using the correction values, the method comprising:
fixing the semiconductor substrate onto the stage;

detecting the height of the surface of the semiconductor substrate fixed onto the stage by the electrostatic chuck;

determining whether the surface of the semiconductor substrate is distorted based on the height of the surface of the semiconductor substrate;

calculating the correction values for the pattern transferred onto the surface of the semiconductor substrate by the exposure based on the height of the surface of the semiconductor substrate when the surface of the semiconductor substrate is distorted; and exposing the surface of the semiconductor substrate to the light using the correction values, wherein in the exposure of the surface of the semiconductor substrate, when the plurality of semiconductor substrates are distorted at a common position, the surfaces of a plurality of the semiconductor substrates are exposed to the light using the correction values, and when the semiconductor substrates are distorted at different positions, the surfaces of the semiconductor substrates are exposed to the light without using correction values for correcting distortions.

7. The method of claim 6, wherein
the correction values (dx, dy) for a certain coordinate point (x, y) on a distorted surface of the semiconductor substrate are represented by $$dx = dz \times \tan \theta_x$$

$$dy = dz \times \tan \theta_y$$

when it is assumed that a height of the coordinate point (x, y) relative to a planar surface of the semiconductor substrate is dz, an angle formed between the planar surface of the semiconductor substrate and a surface contacting the distorted surface of the semiconductor substrate in a cross-section in an X-axis direction is $\theta_x$, and that an angle formed between the planar surface of the semiconductor substrate and a surface contacting the distorted surface of the semiconductor substrate in a cross-section in a Y-axis direction is $\theta_y$.

8. The method of claim 7, wherein
in the detection of the height of the surface of the semiconductor substrate, a plurality of grid points on the surface of the semiconductor substrate are detected, in the calculation of the correction values, the correction values for the pattern transferred onto the surface of the semiconductor substrate by the exposure for the respective grid points are calculated when the surface of the semiconductor substrate is distorted, and in the exposure of the surface of the semiconductor substrate, the surface of the semiconductor substrate is exposed to the light using the correction values for the grid points.

9. The method of claim 6, wherein
in the detection of the height of the surface of the semiconductor substrate, a plurality of grid points on the surface of the semiconductor substrate are detected, in the calculation of the correction values, the correction values for the pattern transferred onto the surface of the semiconductor substrate by the exposure for the respective grid points are calculated when the surface of the semiconductor substrate is distorted, and in the exposure of the surface of the semiconductor substrate, the surface of the semiconductor substrate is exposed to the light using the correction values for the grid points.

10. The method of claim 6, wherein, in the exposure of the surface of the semiconductor substrate, the surface of the semiconductor substrate is exposed to EUV light.

* * * * *